United States Patent [19]

Yonetoku

[11] Patent Number: 5,719,881
[45] Date of Patent: Feb. 17, 1998

[54] TEST PATTERN GENERATING APPARATUS AND METHOD

[75] Inventor: Hirofumi Yonetoku, Kanagawa, Japan

[73] Assignee: NEC Corporation, Tokyo, Japan

[21] Appl. No.: 597,956

[22] Filed: Feb. 7, 1996

[30] Foreign Application Priority Data

Feb. 9, 1995 [JP] Japan .................. 7-021458

[51] Int. Cl.$^6$ .................................................. G06F 11/00
[52] U.S. Cl. .................................. 371/27; 395/183.01
[58] Field of Search .................... 371/24, 25.1, 27; 395/183.01

[56] References Cited

U.S. PATENT DOCUMENTS 4,862,071  8/1989  Sato et al. ........................... 324/73
4,870,345  9/1989  Tomioka et al. ..................... 371/22.3
5,463,639 10/1995  Koishi et al. ........................ 371/27

FOREIGN PATENT DOCUMENTS

Hei-1-217277  8/1989  Japan.

Primary Examiner—Vincent P. Canney
Attorney, Agent, or Firm—Laff, Whitesel, Conte & Saret, Ltd.

[57] ABSTRACT

A test pattern generating apparatus including circuit information/fault information input means 101, test pattern input generating means 102, test pattern input assigning means 103, logical simulation means 104, fault defining means 105, fault simulation means 106, fault extracting (detecting) means 107, initial test pattern extracting means 108, test pattern converting means 109 for assigning undefined values to an initial test pattern, final test pattern extracting means 110, test pattern generation judging means 111, all extracted test pattern merging means 112, and merged test pattern output means 413.

7 Claims, 7 Drawing Sheets

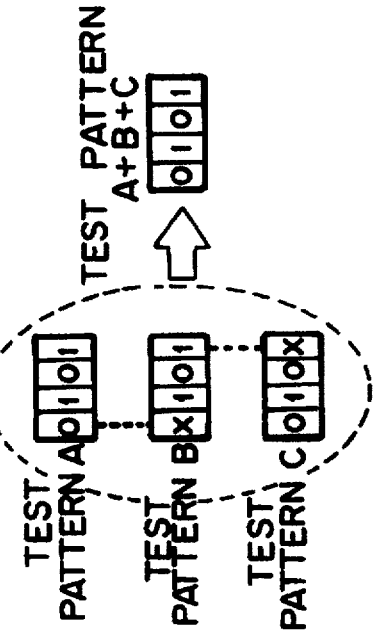
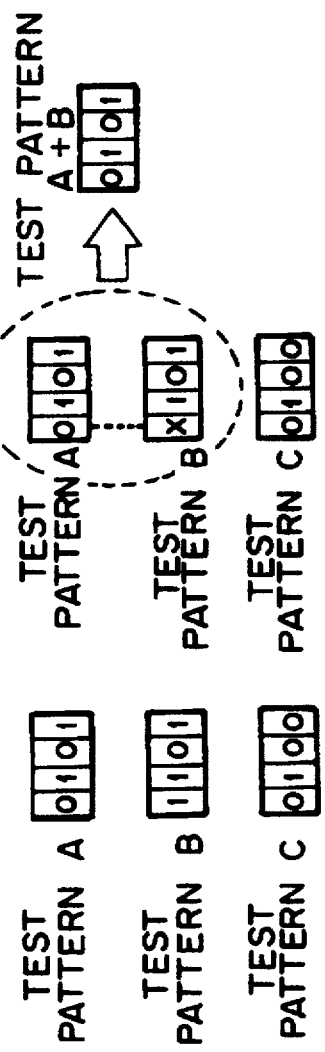

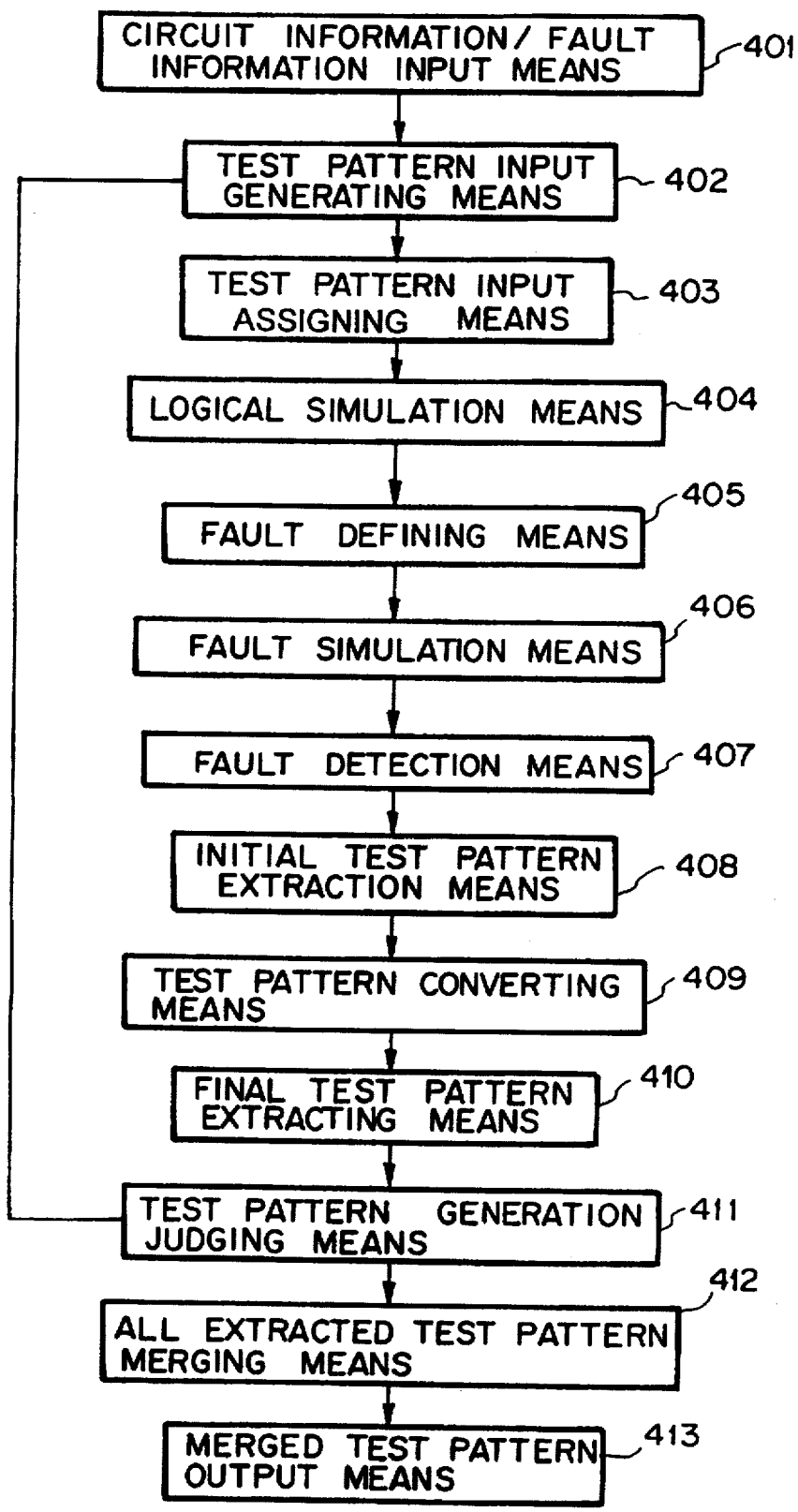

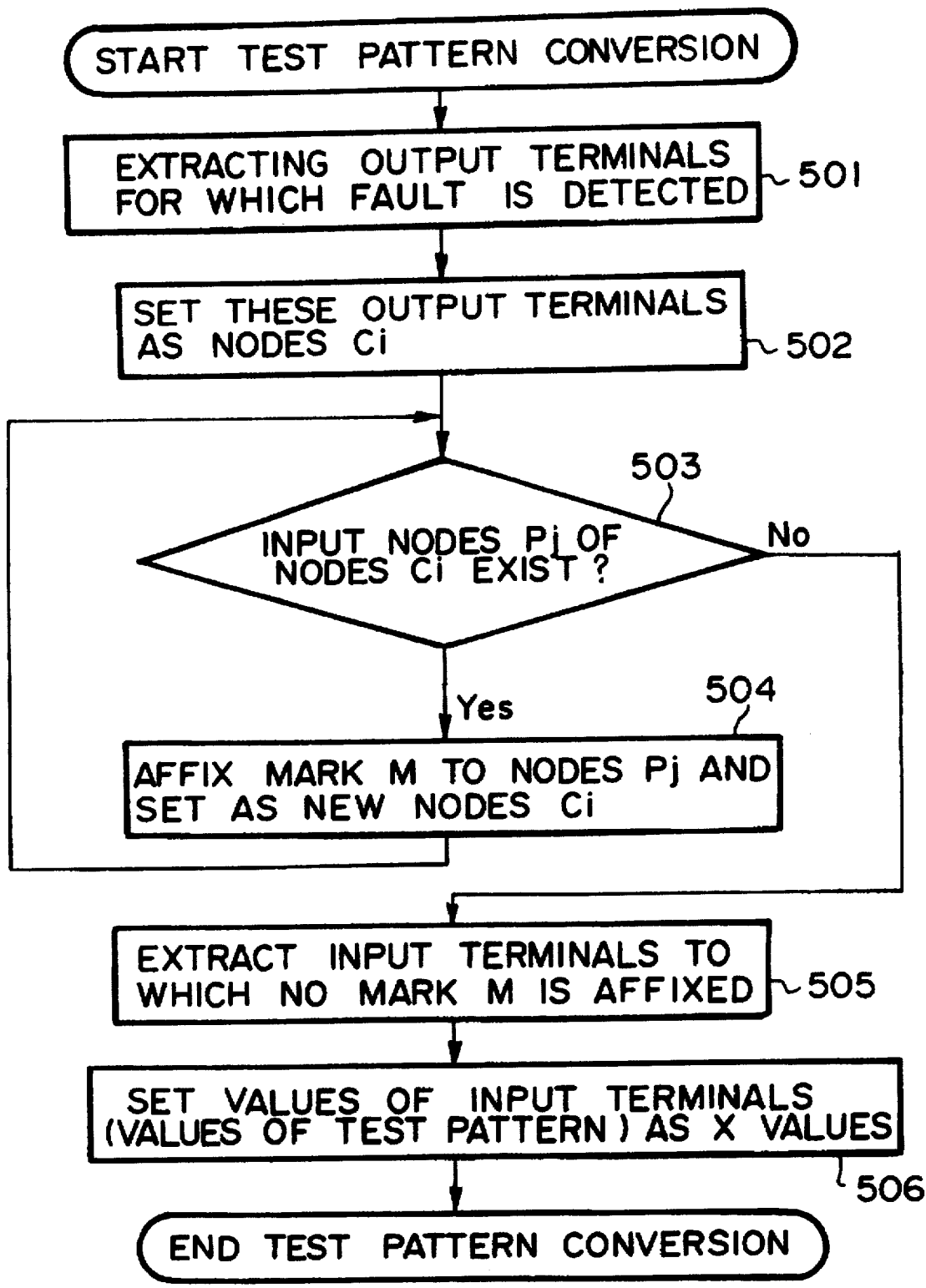

TEST PATTERN GENERATING APPARATUS AND METHOD

BACKGROUND OF THE INVENTION

1. Field of the Invention

The present invention relates to a test pattern generating apparatus and a test pattern generating method, and particularly to test pattern generating apparatus and method for generating a test pattern for a logical circuit while performing a pattern compression. The test pattern generating process is the final process of an LSI manufacturing process, and it belongs to a test process of each of a series of manufacturing, testing and estimating processes.

2. Description of Related Art

Recently, the following test pattern system has been widely used and generalized for a test pattern series which is used to detect a fault group defined for an LSI logical circuit. In this test pattern system, the test pattern series for a logical circuit which serves as a detection target is not directly input to an LSI test machine, but it is subjected to a pattern compression process which reduces the total number of test patterns without reducing a fault coverage of the test pattern series. Thereafter, the pattern-compressed test pattern series is input to the LSI test machine. The propagation of this system has been based on such a situation that the scale of a test pattern corresponding to an LSI is enlarged due to the recent large-scale design of LSIs, and thus the test pattern series corresponding to the large-scale LSI cannot be input to the LSI test machine unless the test pattern series is subjected to the pattern compression. The term "test pattern" for a logical circuit is defined like an assembly of logical values which are input to input terminals of the logical circuit to check whether the logical circuit can perform a correct logical operation which meets its logical design or to detect whether the logical circuit has a fault such as a short-circuit fault (for example, whether a part of the logical circuit is short-circuited to a power source or the ground). Specifically, a manufactured logical circuit such as an IC or the like is mounted in a test machine which is called as "tester", and then an assembly of predetermined logical values (test pattern) is input from the tester to the input terminals of the logical circuit to check whether logical values according to its logical design are output from the output terminals of the logical circuit. If a product (logical circuit) is disqualified as a test result, the product is regarded as a defective and thus it is not put on the market.

In general, the following two steps are performed as a conventional test pattern compression process:

1. To a test pattern for detecting a fault is assigned an undefined value (X value) which does not reduce a fault detection capability of the test pattern.

2. A merging operation of plural test patterns to which undefined values are assigned is tried.

The test pattern compression in which the fault coverage by the test pattern series is not reduced can be performed by using the above two steps. In order to improve an index for indicating the effect of the test pattern compression and the test pattern compression rate, an assignment rate of an undefined value for the test pattern in the first step must be set to a large value. The test pattern compression rate is calculated according to the following equation:

test pattern compression rate=[{(number of test patterns before compression)-(number of test patterns after compression)}/(number of test patterns before compression)]×100 (%)

In this type of conventional test pattern generating apparatus for a logical circuit, the assignment of undefined values (X) for a test pattern for detecting a fault is performed by using a method of setting as an undefined value an input terminal which has no route to an output terminal for which a fault is detected, as described at page 10 of Japanese Laid-open Patent Application No. Hei-1-217277.

A conventional assignment method of undefined values to a test pattern will be described with reference to FIGS. 5 to 7.

FIG. 5 is a functional block diagram showing a conventional general test pattern generating apparatus, and FIG. 6 is a partial flowchart for showing only an assignment processing procedure to a test pattern, which is performed in a test pattern converting means contained as a function of the test pattern generating apparatus. FIG. 6 also shows an applied case of the assignment of undefined values to a test pattern for a logical circuit, which is performed in the test pattern converting means contained in the test pattern generating apparatus.

As shown in FIG. 5, the conventional test pattern generating apparatus includes a circuit information/fault information input means 401 for receiving circuit information containing connection information of a logical circuit and fault defining information, test pattern input generating means 402 for generating input data of a test pattern for fault detection, a test pattern input assigning means 403 for assigning the test input data to input terminals of the logical circuit concerned, a logical simulation means 404 for simulating logical values of respective gates of a normal circuit of the logical circuit for the signal values of the input data on the basis of the test pattern input data assigned to the input terminals, fault defining means 405 for defining, on the basis of the fault defining information, a fault content of the test pattern which is a detection target, fault simulation means 406 for judging and checking through the fault defining means 405 whether a fault defined for a faulty circuit in the test pattern can be detected, fault extracting means 407 for extracting the fault which is detected by the fault simulation means 406, initial test pattern extracting means 408 for extracting an initial test pattern on the basis of the fault-detected and extracted test pattern input, test pattern converting means 409 for assigning predetermined undefined values to the initial test pattern extracted by the initial test pattern extracting means 408, final test pattern extracting means 410 for extracting the test pattern to which the undefined values are assigned, test pattern generation judging means 411 for receiving the extraction result of the final test pattern extracting means 410 to judge whether the test pattern generation is repetitively performed, all extracted test pattern merging means 412 for receiving information indicating that the generation of the test pattern is unnecessary, the information being output from the test pattern generation judging means 411, and then merging test patterns added with undefined values which have been generated until that time, and merged test pattern output means 413 for outputting the test patterns which are merged by the all extracted test patterns merging means 412. When information indicating that the test pattern generation is necessary is output from the test pattern generation judging means 411, the information is transmitted to the test pattern input generating means 402 to generate input data for a test pattern for which a fault should be detected again.

Next, the processing procedure of assigning undefined values to the initial test pattern, which is executed by the test pattern converting means 409 in the prior art, will be described. The processing procedure of the test pattern converting means 409 of the prior art is performed as shown in the flowchart of FIG. 6. First, in step 501, an extraction processing for an output terminal whose fault (failure) is detected by a test pattern serving as a conversion target is carried out. At least one output terminal exists which will be extracted in this step 501. In order to search input terminals which are in connection with the extracted output terminals, a series of processing containing steps 502, 503 and 504 are successively performed subsequently to the step 501. That is, considering the input terminals, the output terminals and logical gates as nodes, the following search processing is performed:

(1) step 502: extracted one or plural output terminals are set as search start point nodes Ci ($1 \leq i \leq n$: $n \geq 1$). Here, n represents the number of the extracted output terminals.

(2) step 503: it is checked whether there exists an input side node Pi ($1 \leq j \leq m$: $m \geq 1$) corresponding to the node Ci ($1 \leq i \leq n$: $n \geq 1$).

If the check result indicates that there exists one or more input side nodes, the process goes to step 504. On the other hand, if the check result indicates that there exists no input side node, the search operation is ended at this time because all the nodes Ci ($1 \leq i \leq n$: $n \geq 1$) are input terminals, and the process goes to step 505.

(3) step 504: a mark M indicating that the input side nodes Pi ($1 \leq j \leq m$: $m \geq 1$) of the nodes Ci ($1 \leq i \leq n$: $n \geq 1$) have been searched is affixed to these input side nodes, and these mark-affixed input side nodes Pi ($1 \leq j \leq m$: $m \geq 1$) are set as new nodes Ci ($1 \leq i \leq n$: n=m). Here, n represents the numerical value which is equal to the total number m of the input side nodes. After the processing of the step 504 is ended, the process returns to the step 503 to repetitively perform the search processing containing the steps 503 and 504.

In the step 503, if it is finally judged that the input side node Pi ($1 \leq j \leq m$: $m \geq 1$) corresponding to the node Ci ($1 \leq i \leq n$: $n \geq 1$) does not exist, the search operation is ended, and the processing of the steps 505 and 506 are carried out. In the step 505, an input terminal which is not searched in the search operation as described above is extracted. That is, since the search operation has been already completed at the time when the processing of the step 505 is carried out, an input terminal to which a mark M is affixed in the search operation exists necessarily. The input terminal to which the mark M is affixed is an input terminal which has a connection route to the output terminal for which a fault is detected. If any input terminal to which no mark M is affixed exists, the input terminal is an input terminal which has no connection route to an output terminal for which a fault is detected. In the step 505, by using the above fact, the extraction processing of extracting an input terminal having no connection route to an output terminal for which a fault is detected is performed. Subsequently, in the step 506, the values of the test pattern which corresponds to input terminals extracted in the step 505 are set to undefined values (X values).

Through the above operation, the assignment processing of the undefined values to the initial test pattern by the conventional test pattern converting means is completed.

Next, a test pattern conversion processing operation on an actual logical circuit by the conventional test pattern converting means 409 will be described for a case where it is applied to a logical circuit shown in FIG. 7. As shown in FIG. 7, the logical circuit has input terminals 601 to 606 and output terminals 617 to 620, and are equipped with NAND gates 607 and 615, inverters 608 and 610, OR gates 609 and 613, NOR gates 611 and 614, AND gates 612 and 616 for the input terminals and the output terminals. In this case, it is assumed that a fault point 621 exists at the output side of the AND gate 612, and it is further assumed that a fault of the fault point 621 is detected by the output terminal 618. The test pattern conversion processing operation is carried out along the processing of the steps 502, 503 and 504 shown in FIG. 6 on the basis of the above assumption.

In the step 502, the output terminal 618 is set as a node search start point node Ci (i=1: C1=output terminal 618). Subsequently, in the step 503, it is checked whether an input side node Pj of the node Ci (i=1: C1=output terminal 618) exists. In the case of the logical circuit shown in FIG. 7, the input side node Pj (j=1: P1=NOR gate 614) exists, and thus the process goes to the step 504 to affix to the input side node Pj (j=1: P1=NOR gate 614) a mark M indicating that the input side node Pj has been searched, and to set the mark-M affixed input side node as a new node Ci (i=1: C1=NOR gate 614). Thereafter, the process returns to the step 503.

Likewise, in the step 503 it is checked whether an input side node Pj of the node Ci (i=1: C1=NOR gate 614) which is newly set in the step 504 exists. In the case of the logical circuit shown in FIG. 7, input side nodes Pj ($1 \leq j \leq 2$: P1=NOR gate 611, P2=AND gate 612) exit, and thus the process goes to the step 504 to affix a mark representing that the input side node Pj (j=1: P1=NOR gate 611) is searched, and to set the input side node affixed with the mark M as a new node Ci ($1 \leq j \leq 2$: C1=NOR gate 611, C2=AND gate 612). Thereafter, the process returns to the step 503.

Likewise, in the step 503, it is checked whether input side nodes Pj of the newly set nodes Ci ($1 \leq j \leq 2$: C1=NOR gate 611, C2=AND gate 612) exist. In this case, since input side nodes Pj ($1 \leq j \leq 3$: P1=NAND gate 607, P2=NOT gate 608, P3=OR gate 609) exist, the process goes to the step 504 to affix a mark representing that the input side nodes are searched, and to set the mark-affixed input side nodes as new nodes Ci ($1 \leq j \leq 3$: C1=NAND gate 607, C2=NOT gate 608, C3=OR gate 609). Thereafter, the process returns to the step 503.

Likewise, in the step 503, it is checked whether input side nodes Pj of the newly set nodes Ci ($1 \leq j \leq 3$: C1=NAND gate 607, C2=NOT gate 608, C3=OR gate 609) exist. In this case, since input side nodes Pj ($1 \leq j \leq 5$: P1=input terminal 601, P2=input terminal 602, P3=input terminal 603, P4=input terminal 604, P5=input terminal 605) exist, the process goes to the step 504 to affix a mark representing that the input side nodes are searched, and to set the mark-affixed input side nodes as new nodes Ci ($1 \leq j \leq 5$: C1=input terminal 601, C2=input terminal 602, C3=input terminal 603, C4=input terminal 604, C5=input terminal 605). Thereafter, the process returns to the step 503. In this case, in the step 503, it is also checked whether the input side nodes of the new nodes Ci ($1 \leq j \leq 5$: C1=input terminal 601, C2=input terminal 602, C3=input terminal 603, C4=input terminal 604, C5=input terminal 605) exist. However, it is apparent that no input side node exists at this time. Therefore, at this time the search operation is ended.

Subsequently, after the search operation is ended, an input terminal to which no mark M is affixed is extracted in the step 505. In the case of the logical circuit shown in FIG. 7, the mark M is not affixed to only the input terminal 606, so that an undefined value (X value) is set to only the value of the test pattern which corresponds to the input terminal 606.

In the conventional test pattern generating apparatus, the assignment of the undefined values is performed by the test pattern converting means as described above. An area which is surrounded by a broken line in FIG. 7 corresponds to a region on which the search operation of the conventional undefined value assigning method has an effect, that is, a search region 622. As described above, in the search operation of the conventional test pattern converting means 409, it is required during the conversion processing to select all the input terminals having connecting relation to an output terminal for which a fault is detected, and this means that the search operation of the conventional test pattern converting means is entirely dependent on the circuit construction of the logical circuit.

In the conventional test pattern generating apparatus and method as described above, the selection processing of the input terminals which must be carried out to assign undefined values to an initial test pattern generated to detect faults of a logical circuit is entirely dependent on the circuit construction of the logical circuit. Therefore, the assignment of the undefined values to the test pattern may be reduced in accordance with the circuit construction of a logical circuit to be detected, so that a test pattern compressibility is reduced. As a result, in some cases, a large-scale test pattern series which is impossible to be input to an LSI test machine must be generated.

SUMMARY OF THE INVENTION

According to one aspect of the present invention, a test pattern generating apparatus includes circuit information/fault information input means for receiving information containing connection information and fault defining information of a logical circuit, test pattern input generating means for generating input data for a test pattern to detect a fault of the logical circuit, test pattern input assigning means for assigning and setting the test pattern input data to input terminals of the logical circuit, logical simulation means for performing a simulation operation of the logical circuit on the basis of the test pattern input data assigned to the input terminals and storing and holding the logical values of respective logical gates and input and output terminals of the logical circuit which are obtained by the logical simulation, fault defining means for defining fault information serving as a detection target in the fault defining information, fault simulation means for performing a fault simulation on all fault definitions serving as detection targets in the fault defining means, and storing and holding fault propagation route information indicating a logical gate located on the fault propagation route which is obtained in the fault simulation operation, and fault detection terminal information indicating a terminal functioning as an output terminal for which a fault is detected, fault detection means for extracting a fault which is detected through the fault simulation operation of the fault simulation means and deleting the detected fault from the faults serving as the detection targets, initial test pattern extracting means for extracting an initial test pattern from all terminals functioning input terminals on the basis of the test pattern input data for which a fault is detected, test pattern converting means for assigning undefined values to the initial test pattern extracted by the initial test pattern extracting means, final test pattern extracting means for extracting, as a undefined-value affixed test pattern, the initial test pattern to which the undefined values are assigned by the test pattern converting means, and storing and holding the test pattern, test pattern generation judging means for checking whether a fault serving as a detection target has still existed in the detection defining information, and transmitting predetermined test pattern generation instructing information to the test pattern input generation means when a fault serving as a detection target exists while outputting predetermined mergence instructing information when no detection target fault exists, all extracted test pattern merging means for performing a mergence processing on undefined-value affixed test patterns which are read out and input by the final test pattern extraction means, to thereby prepare a predetermined test pattern series, and merged test pattern output means for outputting the test pattern series which is merged and generated in the all extraction test pattern merging means.

According to another aspect of the present invention, a test pattern generating method for a logical circuit includes a processing of assigning undefined values to an initial test pattern which is extracted on the basis of test pattern input data for which a fault is detected, the processing comprising a first step (201) for extracting an output terminal for which the fault is detected, a second step (202) for setting the output terminal as a first current node Ci ($1 \leq i \leq n$: $n \geq 1$) of a search operation which is carried out to select input terminals which are required as minimum requirements to fix logical values of the output terminal, a third step (203) for checking whether an input side node Pj ($1 \leq j \leq m$: $m \geq 1$) of the node Ci ($1 \leq i \leq n$: $n \geq 1$) exists, a fourth step (204) for checking whether some nodes Ci exist on a fault propagation route when the input side nodes Pj ($1 \leq j \leq m$: $m \geq 1$) of the nodes Ci ($1 \leq i \leq n$: $n \geq 1$) exist, a fifth step (205) for affixing to the input side nodes Pj ($1 \leq j \leq m$: $m \geq 1$) of the nodes Ci ($1 \leq i \leq n$: $n \geq 1$) a mark M indicating that a search operation has been performed on the input side nodes Pj ($1 \leq j \leq m$: $m \geq 1$), and setting the mark-affixed input side nodes Pj ($1 \leq j \leq m$: $m \geq 1$) as new nodes Ci ($a \leq i \leq b$: $a \geq 1$, $b=a+m-1$) when the nodes Ci ($1 \leq i \leq n$: $n \geq 1$) exist on a fault propagation route in the fourth step, the fifth step returning to the third step 203 when i=n and returning to the step 204 when i<n, a sixth step (206) for affixing the mark M to nodes Pk ($1 \leq k \leq t$: $t \leq m$) of the input side nodes Pj ($1 \leq j \leq m$: $m \geq 1$), which have logical values Lpk ($1 \leq k \leq t$: $t \leq m$) required minimumly to fix the nodes Ci ($1 \leq i \leq n$: $n \geq 1$) to logical values Lci ($1 \leq i \leq n$: $n \geq 1$), and setting the mark-M affixed input side nodes Pk ($1 \leq k \leq t$: $t \leq m$) as new nodes Ci ($a \leq i \leq b$: $a \geq 1$, $b=a+t-1$) when no node Ci ($1 \leq i \leq n$: $n \geq 1$) exists on the fault propagation route in the fourth step, the sixth step returning to the step 203 when i=n and returning to the step 204 when i<n, a seventh step (207) for extracting input terminals to which no mark is affixed while performing no search when no input side node Pj ($1 \leq j \leq m$: $m \geq 1$) of the nodes Ci ($1 \leq i \leq n$: $n \geq 1$) exist in the third step, and an eight step (208) for assigning the undefined values to the initial test pattern by setting the undefined values to the input terminals extracted in the seventh step.

BRIEF DESCRIPTION OF THE DRAWINGS

FIG. 4 is a diagram showing a test pattern merging manner;

FIG. 5 is a functional block diagram showing the prior art;

FIG. 6 is a flowchart for a processing procedure of assigning undefined values to a test pattern in the prior art.

DETAILED DESCRIPTION OF THE PREFERRED EMBODIMENT

A preferred embodiment according to the present invention will be described hereunder with reference to the accompanying drawings.

Figure 1:
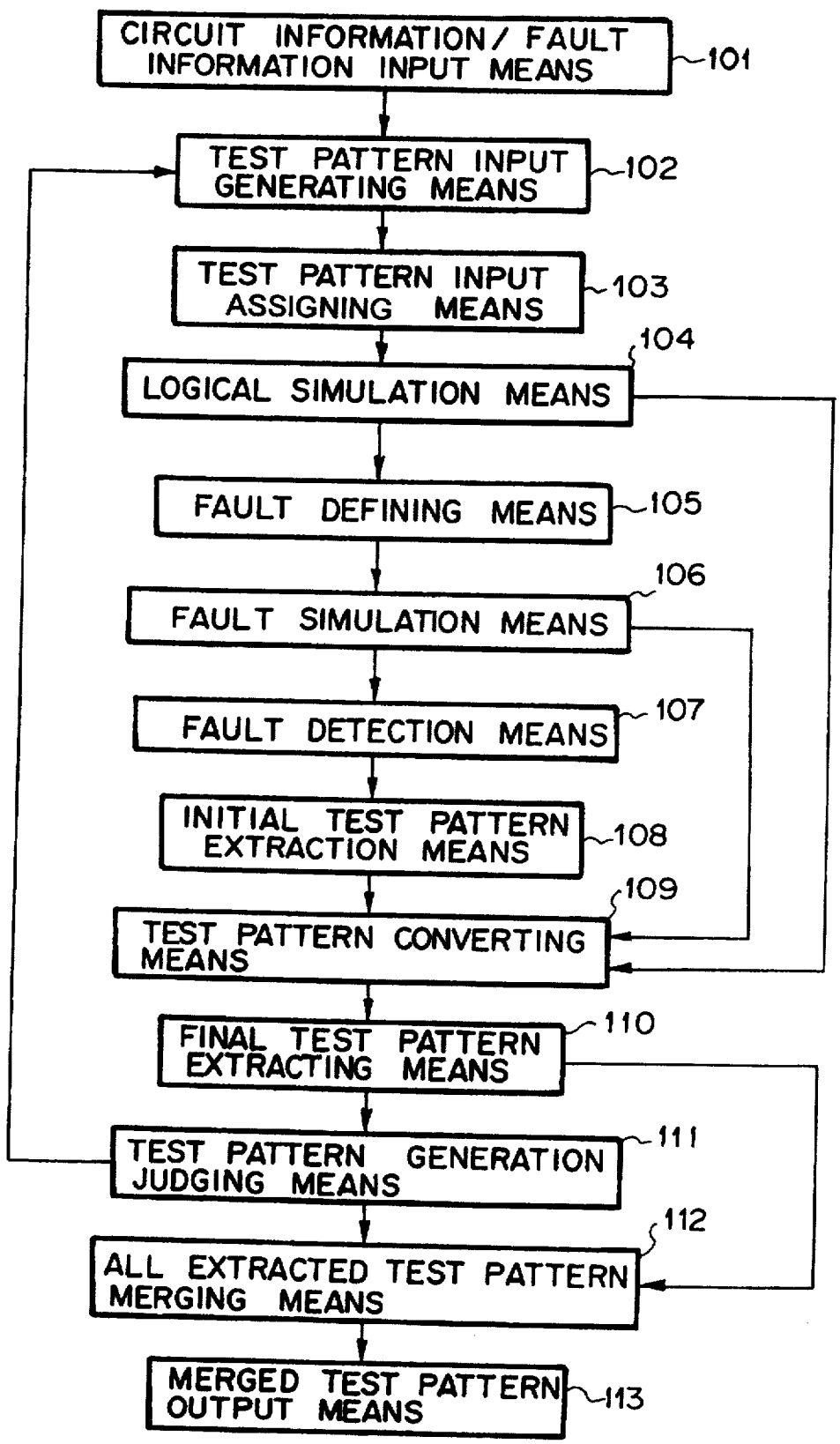
FIG. 1 is a functional block diagram showing an embodiment of the present invention.
Figure 2:
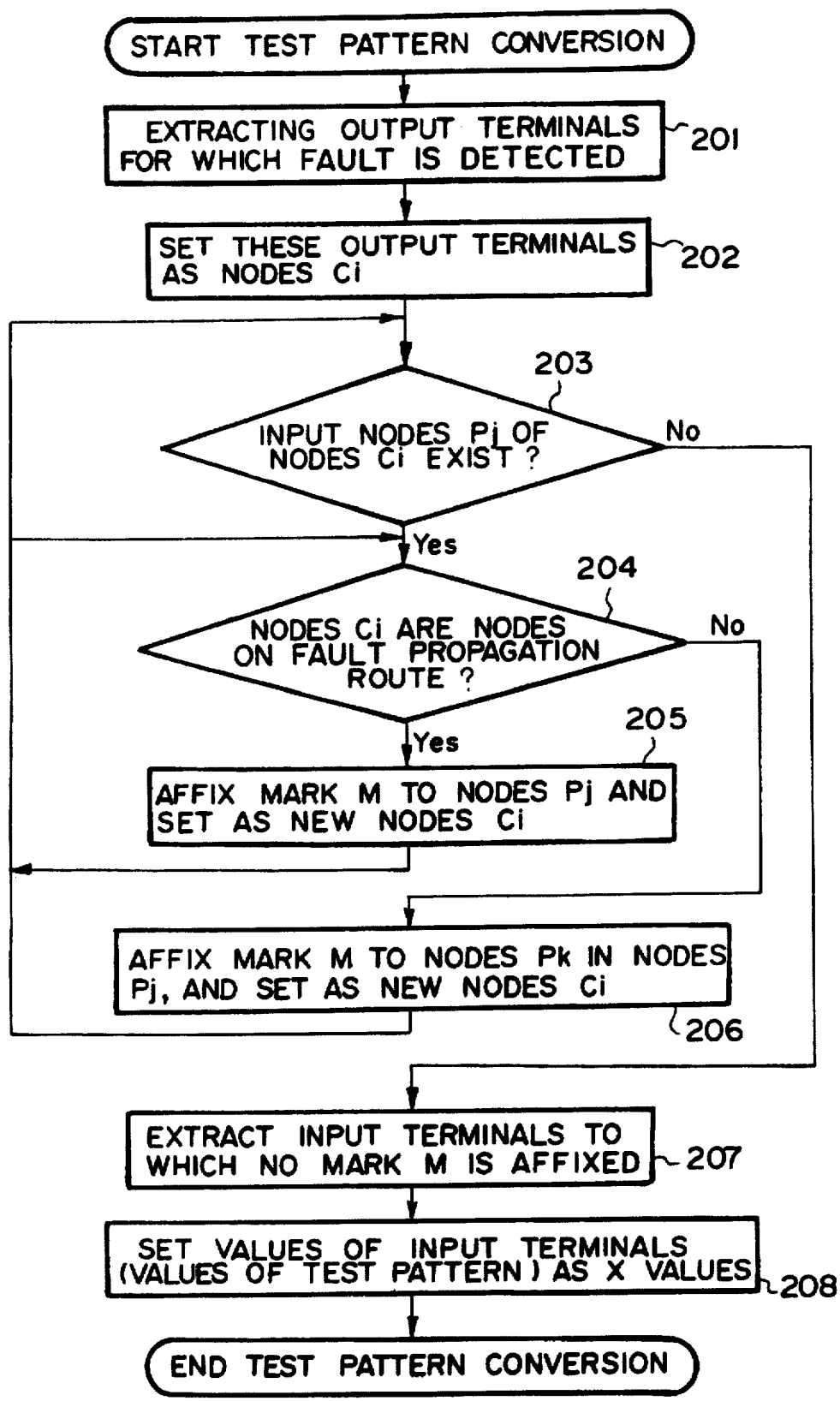
FIG. 2 is a flowchart showing a processing procedure of assigning undefined values to a test pattern in the embodiment of the present invention.
Figure 3:
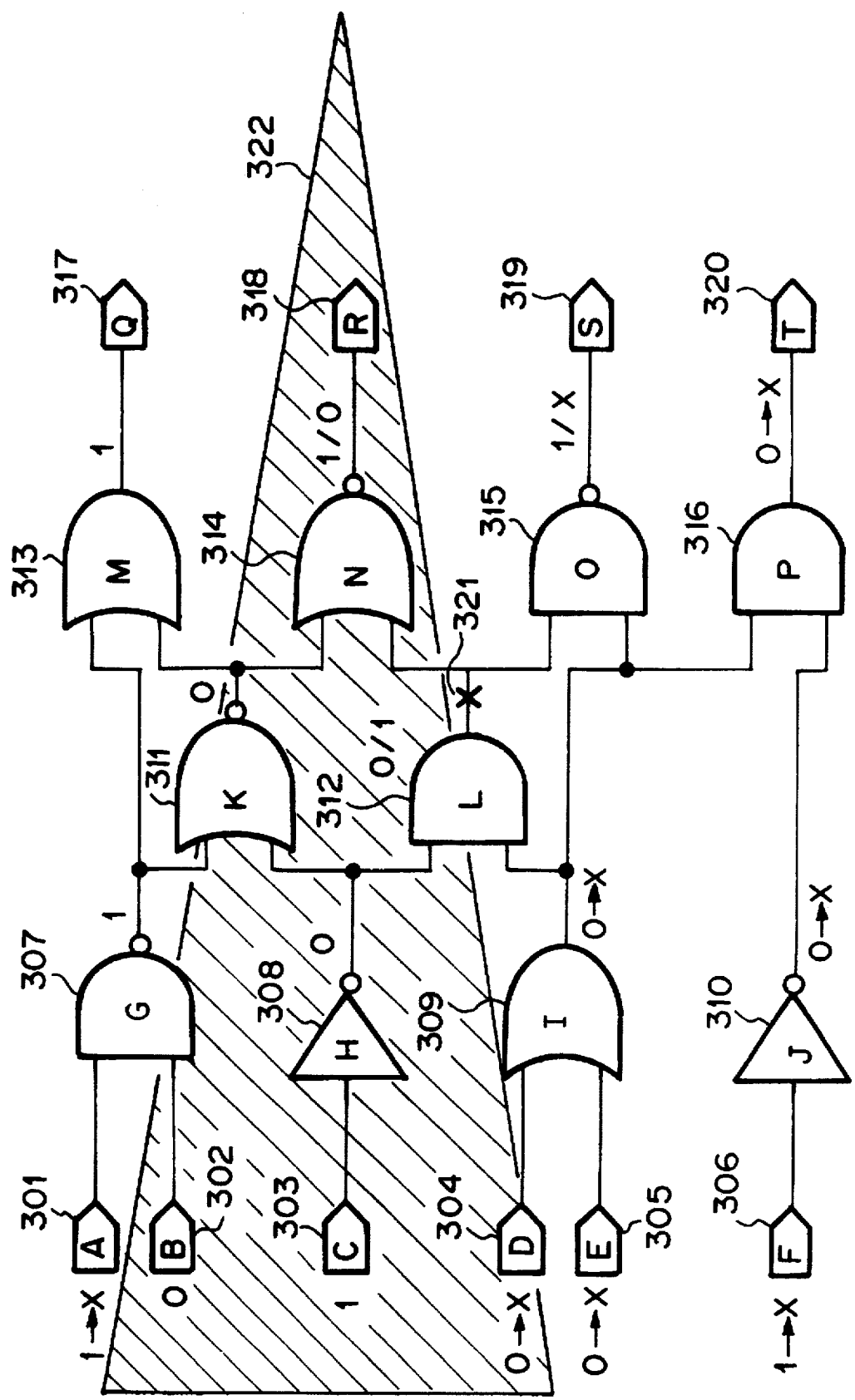
FIG. 3 is a diagram showing a case where undefined values are assigned to a test pattern of a logical circuit in the embodiment of the present invention.
Figure 7:
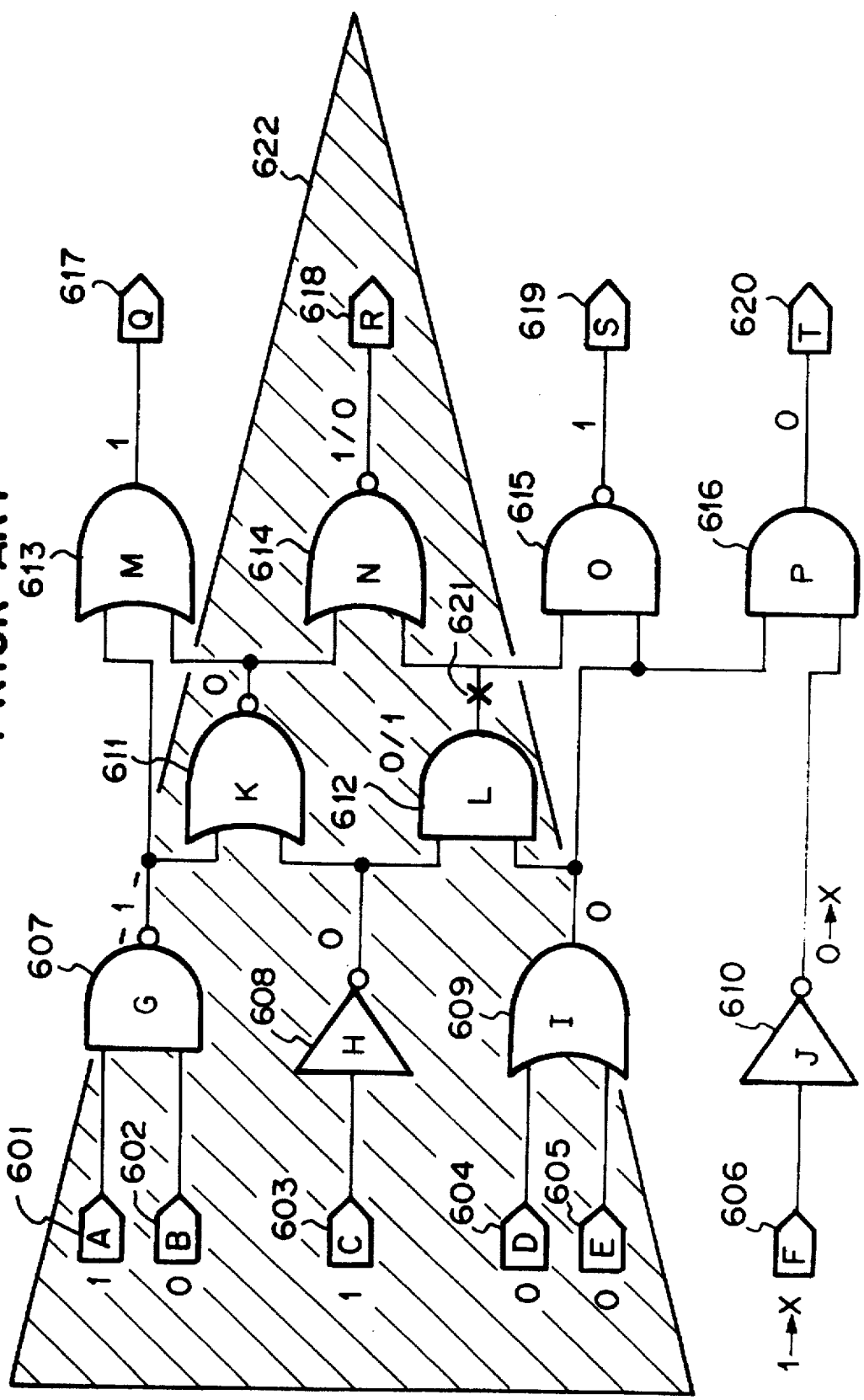
FIG. 7 is a diagram showing a case where undefined values are assigned to a test pattern of a logical circuit in the prior art.

FIG. 1 is a functional block diagram showing an embodiment of the present invention, and FIG. 2 is a flowchart for a processing of assigning undefined values to a test pattern, which is carried out by test pattern converting means contained in the embodiment. FIG. 3 shows an applied case of the embodiment in which the undefined value assigning operation is applied to a test pattern for a logical circuit.

As shown in FIG. 1, the test pattern generating apparatus of this embodiment includes circuit information/fault information input means 101, test pattern input generating means 102, test pattern input assigning means 103, logical simulation meas 104, fault defining means 105, fault simulation means 106, fault detection means 107, initial test pattern extraction means 108, test pattern converting means 109, final test pattern extracting means 110, test pattern generation judging means 111, all extracted test patterns merging means 112, and merged test pattern output means 413.

In FIG. 1, circuit information containing connection information and fault defining information of a logical circuit which is a fault detection target is input to the circuit information/fault information input means 101. Here, the connection information is defined as information which describes the connection relationship of individual gates over the whole circuit, for example, such a circuit connection arrangement that the outputs of gates H 303 and I 304 are connected to the inputs of a gate L 312, and the output of the gate L 312 is connected to the inputs of the gates N 314 and 0 315 as shown in FIG. 3. Further, the fault defining information is defined as information which defines such a fault that the input terminal or output terminal of a gate is short-circuited to a power source wiring portion or ground wiring portion due to minute variation of a manufacturing process condition. For example, such a short-circuit fault is generally called as "a stuck-at fault" in a test filed. Such a fault that the terminal of the gate is short-circuited to a power source portion is called as "1-stuck-at fault", and such a fault that the terminal of the gate is short-circuited to a ground portion is called as "0-stuck-at fault". The fault defining information of this invention is defined as information describing what stuck-at fault is defined for which terminal (portion). For example, "321" of FIG. 3 means that 1-stuck-at fault is defined for the output terminal (portion) of the AND gate L 312.

The test pattern input generating means 102 receives the circuit information from the circuit information/fault information input means 101 to generate and output test pattern input data based on random numbers or test pattern input data which are automatically generated for any fault definition. The test pattern input data output from the test pattern input generating means 102 are input to the test pattern input assigning means 103, and the input data are assigned to the input terminals of the logical circuit. In the logical simulation means 104, a logical simulation is performed on the logical value of each gate in a normal circuit of the logical circuit in correspondence with the signal values of the input data on the basis of the test pattern input data which are assigned to the input terminals in the test pattern input assigning means 103, and the logical values of the logical gates and the input/output terminals on a fault propagation route which are obtained during the execution of the logical simulation are stored and held in the logical simulation means 104. In the fault defining means 105, a fault which is a detection target is defined on the basis of the fault defining information because it is used for a fault simulation operation which will be performed at a subsequent stage. In the fault simulation means 106, it is checked through the fault simulation whether the fault which is defined for the faulty circuit in the test pattern through the fault defining means 105 can be actually detected, and the logical values of the logical gates on the fault propagation route which are obtained through the fault simulation and the terminal serving as an output terminal for which a fault is detected, are stored and held as fault propagation information in the fault simulation means 106. In the fault extracting(detecting) means 107, a fault which is detected through the fault simulation in the fault simulation means 106 is extracted, and the fault is deleted from the faults serving as detection targets. In the initial test pattern extracting means 108, an initial test pattern is extracted and output on the basis of the test pattern input which is detected and extracted through the fault simulation.

In the test pattern converting means 109, by referring to the logical values of the logical gates and the input/output terminals on the fault propagation route which are read out and transmitted from the logical simulation means 104, and the fault propagation route information which is read out and transmitted from the fault simulation means 106, predetermined undefined values are assigned to the initial test pattern which is extracted by the initial test pattern extracting means 108. Through the assigning operation of the undefined values, a selection processing for terminals serving as input terminals which are unrequired to detect the detected fault is performed, and the undefined values are set to the values of the initial test pattern corresponding to the terminals. In the final test pattern extracting means 110, the initial test pattern to which the undefined values are assigned is extracted as an undefined-value affixed test pattern and it is stored and held in the final test pattern extracting means 110. In the test pattern generation judging means 111, in accordance with the extraction result of the final test pattern by the final test pattern extracting means 110, it is checked whether a fault of a detection target has still existed in the fault defining information, and it is also judged whether the test pattern generation should be repeated again. If it is judged as the check result that the fault of the detection target has still existed, predetermined test pattern input instructing information is output, and transmitted to the test pattern input generating means 102. The test pattern input generating means 102 receives the circuit information from the circuit information/fault information input means 101 in response to the input of the test pattern input instructing information to generate and output the test pattern input data again. The subsequent operation of the test pattern input assigning means 103 is performed in the same manner as described above. In the all extracted test pattern merging means 112, in response to the information instructing that the generation of the test pattern is not required, which is output from the test pattern generation judging means 111, all the initial test patterns (undefined value affixed test pattern) which are successively read out and transmitted, and assigned with undefined values are subjected to the merging processing and then output. The merged test pattern to which the undefined values are affixed is output through the merged test pattern output means 113.

Next, the conversion processing of the test pattern converting means 109 which is the main feature of the present invention will be described with reference to FIG. 2. FIG. 2 is a flowchart showing a processing flow of assigning predetermined undefined values to an initial test pattern extracted by the initial test pattern extracting means 108 in the test pattern converting means 109. The detailed processing of each step will be described every item.

(1) Step 201: an extracting processing of terminals (terminals functioning output terminals) for which a fault is detected by a test pattern serving as a conversion target. For example, the same test pattern is set to the input terminals of a circuit under such a condition that a fault occurs, and to the input terminals of a circuit under such a condition that no fault occurs. In this case, if the values of the same output terminals of these circuits are different from each other, the output terminal is regarded as an output terminal for which the fault is detected (hereinafter referred to as "fault-detected output terminal"). For example, in FIG. 3, an output terminal 318 is the fault-detected output terminal. "1/0" which is written in the vicinity of the terminal 318 represents a logical value of the output terminal 318 of the circuit. That is, "1" represents the logical value of the output terminal 318 of the circuit under the condition that no fault occurs, and "0" represents the logical value of the output terminal 318 of the circuit under the condition that the fault occurs.

(2) Step 202: in a search processing of selecting minimumly required terminals (terminals functioning input terminals) from the terminals (terminals functioning as output terminals) extracted in the step 201 to fix the logical values (logical values stored and held in the logical simulation means 104) of terminals functioning these output terminals, these extracted terminals (terminals functioning as the output terminals) are set as search start points. That is, considering the input terminals, the output terminals and the logical gates as nodes used for the search operation, the terminals (terminals functioning as output terminals) for which a fault is detected are set as first current nodes $Ci$ ($1 \leq i \leq :n \geq 1$) for the search operation. In this case, n represents the number of the extracted terminals (terminals functioning as output terminals).

(3) Step 203: it is checked whether some input side nodes $Pj$ ($1 \leq j \leq m$: $m \geq 1$) of the nodes $Ci$ ($1 \leq i \leq :n \geq 1$) exist. If it is judged that at least input side node exists, the process goes to step 204. If no input side node exists, all the nodes $Ci$ ($1 \leq i \leq :n \geq 1$) are input terminals. Therefore, the search operation is ended and the process goes to step 207.

(4) Step 204: it is checked whether the nodes $Ci$ ($1 \leq i \leq :n \geq 1$) are nodes on a fault propagation route which are stored and held in the fault simulation means 106. In this check operation, if the nodes $Ci$ ($1 \leq i \leq :n \geq 1$) are the nodes on the fault propagation route, the process goes to step 205 for only the nodes. If the nodes $Ci$ are not the nodes on the fault propagation route, the process goes to step 206 for only the nodes.

(5) Step 205: when the nodes $Ci$ ($1 \leq i \leq :n \geq 1$) are the nodes on the fault propagation route in the step 204, all the input side nodes $Pj$ ($1 \leq j \leq m$: $m \geq 1$) of the nodes $Ci$ ($1 \leq i \leq n$: $n \geq 1$) are affixed with a mark M indicating that the search operation has been performed on the input side nodes $Pj$, and these input side nodes $Pj$ ($1 \leq j \leq m$: $m \geq 1$) are set as new nodes $Ci$ ($a \leq i \leq b$: $a \geq 1$, $b=a+m+1$). In this step 205, if i=n, the process goes to step 203, and the step 203 and the subsequent steps are repetitively carried out again. If i<n, the process returns to step 204 to repetitively perform the step 204 and the subsequent steps again.

(6) Step 206: a mark M indicating that the search has ben performed is affixed to nodes $Pk$ ($1 \leq k \leq t$: $t \leq m$) having logical values $Lpk$($1 \leq k \leq t$: $t \leq m$) which are contained in the input side nodes $Pj$ ($1 \leq j \leq m$: $m \geq 1$) of the nodes $Ci$ ($1 \leq i \leq n$: $n \geq 1$) and are minimumly required to fix the nodes $Ci$ ($1 \leq i \leq n$: $n \geq 1$) to the logical values $Lci$ ($1 \leq i \leq n$: $n \geq 1$) which are stored and held in the logical simulation means 104, and these nodes are set as new nodes $Ci$ ($a \leq i \leq b$: $a \geq 1$, $b=a+t-1$). In this step 206, if i=n, the process returns to step 203 to repetitively carry out the step 203 and the subsequent steps again. If i<n, the process returns to step 204 to repetitively carry out the step 204 and the subsequent steps.

In the processing procedure containing the processing of the steps 204, 205 and 206, the processing is carried out every node $Ci$, and it is repetitively performed at times which correspond to the number of the nodes $Ci$ (n). Thereafter, in the search operation containing the steps 203, 204, 205 and 206, it is finally judged in the step 203 that the input side node $Pj$ ($1 \leq j \leq m$: $m \geq 1$) of the nodes $Ci$ ($1 \leq i \leq n$: $n \geq 1$) does not exist, the process goes to step 207.

(7) Step 207: in the step 203, if it is judged in the step 203 that the inside node $Pj$ ($1 \leq j \leq m$: $m \geq 1$) of the nodes $Ci$ ($1 \leq i \leq n$: $n \geq 1$) does not exist, input terminals which are not searched in the search operation are extracted. The input terminal to which the mark is not affixed in the search operation means a terminal (a terminal functioning as an input terminal) which is not required for a fault detected by the test pattern input at that time.

(8) Step 208: by setting undefined values to the terminals (terminals functioning as input terminals) extracted in the step 207, the undefined values (X values) are assigned to the initial test pattern, and the test pattern conversion processing is ended. Next, the test pattern conversion processing of the test pattern converting means 109 of this embodiment on an actual logical circuit will be described with reference to FIG. 3. FIG. 3 is a diagram showing an actual logical circuit to which the test pattern conversion processing as described above is applied. The circuit construction of the logical circuit shown in FIG. 3 is identical to that of FIG. 6. That is, as shown in FIG. 3, the logical circuit shown in FIG. 3 includes input terminals 301 to 306 and output terminals 317 to 320, and further includes NAND gates 307 and 315, NOT gates 308 and 310, OR gates 309 and 313, NOR gates 311 and 314, and AND gates 312 and 316 which are provided in correspondence with the input and output terminals. In this case, a fault point 321 is assumed to exist at the output side of the AND gate 312.

The test pattern conversion processing flow containing steps of 201 to 208 shown in FIG. 2 will be described on the assumption that a fault due to the fault point 321 is detected at the output terminal 318. The logical gates on the fault propagation route of the logical circuit of FIG. 3 are the NOR gate 314 and the output terminal 318.

In the step 201, an output terminal for which a fault is detected is extracted. In this logical circuit, the output terminal which is extracted in the step 201 is the output terminal 318 itself. Subsequently, in the step 202, the output terminal 318 which is extracted in the step 201 is set as a node $Ci$ (i=1: C1=output terminal 318) of a node search start point. In the step 203, it is checked whether there exists an input side node $Pj$ of the node $Ci$ (i=1: C1=output terminal 318). In the case of the logical circuit of FIG. 3, since the input side node $Pj$ (j=1: P1=NOR gate 314) exists, the process goes to step 204. In the step 204, it is checked whether the node $Ci$ (i=1: C1=output terminal 318) exists on the fault propagation route. In this case, since the node $Ci$ (i=1: C1=output terminal 318) exists on the fault propagation route, the process goes to step 205. In the step 205, the mark representing the execution of the search operation is affixed to the input side node $Pj$ (j=1: P1=NOR gate 314) of Ci (i=1: C1=output terminal 318), and the input side node to which the mark M is affixed is set as a new node Ci (i=1: C1=NOR gate 314). Since there is no other current target node C, the process returns to the step 203.

Likewise, in the step 203, the node Ci (i=1: C1=NOR gate 314) which is newly set in the step 204 is set as a current processing target node C, and it is checked whether there exists an input side node Pj of the node Ci (i=1: C1=NOR gate 314). In the case of the logical circuit of FIG. 3, since input side nodes Pj ($1 \leq j \leq 2$: P1=NOR gate 311, P2=AND gate 312) exist, the process goes to the step 204. In the step 204, it is checked whether the node Ci (i=1: Ci=NOR gate 314) exists on the fault propagation route. In this case, as is apparent from FIG. 3, the node Ci (i=1: C1=NOR gate 314) is located on the fault propagation route, and thus the process goes to the step 205. In the step 205, the mark M indicating that the search has been performed is affixed to the input side nodes Pj ($1 \leq j \leq 2$: P1=NOR gate 311, P2=AND gate 312) of Ci (i=1: C1=NOR gate 314), and the input side nodes to which the mark M is affixed are set as new nodes Ci ($1 \leq i \leq 2$: C1=NOR gate 311, C2=AND gate 312). There is no other current target node C, and thus the process returns to the step 203 again.

In the step 203, likewise, the nodes Ci ($1 \leq i \leq 2$: C1=NOR gate 311, C2=AND gate 312) which are newly set in the step 205 are set as a current processing target node C, and it is checked whether any one of the nodes Ci ($1 \leq i \leq 2$: C1=NOR gate 311, C2=AND gate 312) has an input side node Pj. In the case of the logical circuit shown in FIG. 3, the input side nodes Pj ($1 \leq j \leq 3$: P1=NAND gate 307, P2=NOT gate 308, P3=OR gate 309) exist, and thus the process goes to the step 204. In the case of this logical circuit, there are two nodes C containing C1:NOR gate 311 and C2:AND gate 312 as target nodes as the present time, and thus the processing of the steps 204, 205 and 206 are repetitively performed at two times in correspondence with these two nodes C.

First, the processing containing the steps 204, 205 and 206 is performed on the node C1:NOR gate 311. In the step 204, it is checked whether the node C1:NOR gate 311 exists on the fault propagation route. In this case, as is apparent from FIG. 3, the node C1:NOR gate 311 is not located on the fault propagation route, and thus the process goes to step 206. In the step 206, the following processing is performed. In the case of the logical circuit shown in FIG. 3, the logical value at the output side of the NOR gate 311 is equal to "0" in correspondence with the input levels of the input terminals 301, 302, 303, 304, 305 and 306. Accordingly, only one input side node whose logical value Lpk ($1 \leq k \leq 2$) is equal to "1" may be selected from the input side nodes of the NOR gates 311. With this selection, the logical value Lc1 of the node C1: NOR gate 311 can be fixed to "0". Accordingly, in this example, the input side node Pk whose logical value Lpk is equal to "1" is the NAND gate 307. That is, the input side node to be selected is Pk (k=1: P1=NAND gate 307). Therefore, the mark M indicating that the search has been performed is affixed to the input side node Pk (k=1: P1=NAND gate 307) to set the input side node Pk as a new node Ci (i=1: C1=NAND gate 307). Since C2:AND gate 312 exists as the current target node C, the process returns to the step 204.

In the step 204, the processing for the node C2:AND gate 312 which is the other current target is carried out. That is, it is checked whether the node C2: AND gate 312 exists on the fault propagation route. In this case, it is apparent from FIG. 3 that the node C2:AND gate 312 is not located on the fault propagation route, and thus the process goes to step 206. In the step 206, the following processing is carried out.

In this case, the logical value Lc2 of the node C2:AND gate 312 is equal to "0". Therefore, in order for the logical value of the AND gate 312 to be equal to "0", only one input side node whose logical value Lpk ($1 \leq k \leq 2$) is equal to "0" may be selected from the input side nodes of the AND gate 312. With this selection, the logical value Lc2 of the node C2:the AND gate 312 can be fixed to "0". However, in this case, two nodes of the NOT gate 308 and the OR gate 309 exist as the input side node Pk whose logical value Lpk is equal to "0". At this time, there occurs a problem as to which node should selected from the two nodes. The number of input nodes which are required to fix the logical values of the input side nodes, the number of stages from these input side nodes to the input terminals, etc. are considered as factors for the above selection. As a result, the input side node which is selected in this logical circuit is Pk (k=1: P1=NOT gate 308). Accordingly, the mark M indicating that the search has been performed is affixed to the input side node Pk (k=1: P1=NOT gate 308), and it is set as a new node Ci (i=2: C2=NOT gate 308). Since there is no other current target node C, the process returns to the step 203.

In the step 203, the newly set nodes Ci ($1 \leq i \leq 2$: C1=NAND gate 307, C2=NOT gate 308) are set as processing targets at the present time, and it is checked whether any one of the nodes Ci has an input side node. In this case, there exist input side nodes Pj ($1 \leq j \leq 3$: P1=input terminal 301, P2=input terminal 302, P3=OR gate 309), and thus the process goes to the step 204. In the case of the logical circuit, two nodes C containing C1:NAND gate 307 and C2:NOT gate 308 exist as a target node C at the present time, and thus the processing of the steps 204, 205 and 206 is repetitively performed two times in correspondence with the above two nodes C.

First, the processing containing the steps 204, 205 and 206 is performed on the node Ci (i=2: C1=NAND gate 307).In the step 204, it is checked whether the node C1: 307).In this case, as is apparent from FIG. 3, the node C1:NAND gate 307 is not located on the fault propagation route, and thus the process goes to the step 206. In the step 206, the following processing is performed.

In the case of this logical circuit, the logical value Lc1 at the output side of the node C1:NAND gate 307 is equal to "1" in correspondence with the respective levels of the input terminals 301, 302, 303, 304, 305 and 306. Accordingly, in order to make the logical value of the NAND gate 307 equal to "1", only one input side node whose logical value Lpk ($1 \leq k \leq 2$) is equal to "0" may be selected from the input side nodes of the NAND gate 307. With this selection, the logical value Lc1 of the NAND gate 307 can be fixed to "1". Accordingly, in this case, the input side node Pk whose logical value Lpk is equal to "0" is Pk (k=1: P1=input terminal 302). That is, the input side node to be selected is terminal 302). Therefore, the mark M Pk (k=1: P1=input terminal 302). Therefore, the mark M indicating that the search has been performed is affixed to the input side node Pk (k=1: P1=input terminal 302), and the input side node Pk is set as a new node Ci (i=1: C1=input terminal 302). Since the node C2:NOT gate 308 has still existed as the current target node C, the process returns to the step 204 again. In the step 204, the processing containing the steps 204, 205 and 206 is performed on the other current target node Ci (i=2: C2=NOT gate 308). That is, it is checked whether the node C2:NOT gate 308 exists on the fault propagation route. In this case, as is apparent from FIG. 3, the node C2:NOT gate 308 is not located on the fault propagation route, and thus the process goes to the step 206. In the step 206, the following processing is performed.

In the case of this logical circuit, the node C2 is the NOT gate 308, and the input terminal 303 is necessarily selected as the input side node Pk thereof because the NOT gate 308 is of a one-input and one-output gate type. That is, the input side node to be selected is Pk (k=1: P1=input terminal 303). Therefore, the mark M indicating that the search has bee performed is affixed to the input side node Pk, and the input side node Pk is set as a new node Ci (i=2: C2=input terminal 303). Since there is no other current target node C, the process returns to the step 203.

In the step 203, the newly set nodes Ci ($1 \leq i \leq 2$: C1=input terminal 302, C2=input terminal 303) are set as processing target at the present time, and it is checked whether any one of the nodes C has an input side node. In this case, any node Ci has no input side node, and thus the search operation is ended at this time, and the process goes to step 207. As a result of the search operation as described above, there exist input terminals affixed with the mark M indicating that the search has been performed, and input terminals affixed with no mark M. In the step 207, the input terminals to which no mark is affixed are extracted. That is, in the case of this logical circuit, the input terminals 301, 304, 305 and 306 are extracted. In the step 208, undefined values (X values) are set as values of a test pattern which correspond to the input terminals (input terminals 301, 304, 305 and 306) which are affixed with no mark and extracted in the step 207, and then the conversion processing of the test pattern converting means of the present invention is completed.

A search region 322 as indicated by a broken line of FIG. 3 is a search processing region to assign undefined values to the initial test pattern.

Finally, a basic operation when input side nodes Pk ($1 \leq k \leq t$: $t \leq m$) having minimumly required logical values Lpk ($1 \leq k \leq t$: $t \leq m$) are selected to fix the nodes Ci ($1 \leq i \leq n$: $n \geq 1$) to logical values Lci ($1 \leq i \leq n$: $n \geq 1$) in the processing of the step 206, will be described hereunder for plural kinds of logical elements every logical value and its kind.

AND: one input side node Pk of Lci=0 and Lpk=0 is selected.

AND: Lci=1: All input side nodes P are selected.

NAND: Lci=0: All input side nodes P are selected.

NAND: input side nodes Pk of Lci=1: Lpk=0 are selected.

OR: Lci=0: all input side nodes P are selected.

OR: one input side node Pk of Lci=1 and Lpk=1 is selected.

NOR: one input side node Pk of Lci=0 and Lpk=1 is selected.

NOR :Lci=1: all input side nodes P are selected.

NOT :Lci=0: all input side nodes P are selected.

NOT :Lci=1: all input side nodes P are selected.

Particularly for the AND gate and the NOR gate when the logical value is equal to "0", and for the NAND gate and the OR gate when the logical value is equal to "1", the logical value of the logical element can be fixed by selecting only one input side node of the logical element, so that the search operation in the flowchart of FIG. 2 can be reduced.

Returning to FIG. 1, an undefined-value affixed test pattern is extracted in the final test pattern extracting means 110 after the above processing. In the test pattern generation judging means 111, it is judged whether there still exists a fault definition for which a test pattern generation processing should be performed.

In the all extracted test pattern merging means 112, all the test patterns which are extracted in the final test pattern extracting means 110 are merged (compressed) in such a manner as shown in FIG. 4(a) to 4(c). FIG. 4(a) to 4(c) is a diagram showing a test pattern merging manner. In FIG. 4(a) to 4(c), it is assumed that there are three kinds of test patterns A, B and C. In the case in FIG. 4(a), there is no undefined value x, and thus it is impossible to merge the test patterns. Accordingly, the number of test pattern series is equal to three, and thus compression cannot be performed. In the case in FIG. 4(b), an undefined value x is contained in the test pattern B, and least significant three bits (second, third and fourth bits from the right side) of the test pattern B are identical to those of the test pattern A, so that the test patterns A and B can be merged with each other. Accordingly, the number of the test pattern series can be compressed to 2. In the case in FIG. 4(c), an undefined value x is contained in each of the test patterns B and C, and thus the test patterns A, B and C can be merged with one another. Accordingly, the number of the test pattern series is compressed to 1.

In the merged test pattern output means, the test pattern group which is merged in the all extracted test pattern merging means 112 is output in a format which is used to transmit the test pattern to a subsequent stage (a test process using a test machine).

As described above, according to the test pattern generating apparatus and the test pattern generating method of the present invention, when applied to a logical circuit, the property that the results of the logical simulation and the fault simulation which are performed on the logical circuit, and the logical values of plural kinds of logical elements can be fixed by unique input values is applied to the processing of assigning undefined values to an initially generated test pattern, whereby the selection processing which is performed to assign the undefined values can be performed without being entirely dependent on the construction of the logical circuit. Accordingly, the following advantages can be obtained. That is, a search range for searching input terminals required to fix the logical value of an output terminal for which a fault is detected can be greatly reduced, and the number of the input terminals to which undefined values are assigned can be greatly increased. That is, the disadvantage of the prior art that the assignment of the undefined values to the test pattern may be reduced in accordance with the construction of the logical circuit, can be avoided.

With the above advantages, a larger number of test patterns can be merged when a test pattern merging operation is performed, and thus a test pattern series which is required to test a logical circuit can be further scaled down. This means that the scale of a logical circuit which can be tested by a predetermined LSI test machine can be more enlarged.

What is claimed is:

1. A test pattern generating apparatus comprising:
   circuit information input means for receiving information containing connection information and fault defining information of a logical circuit and for inputting test pattern input data to terminals of the logical circuit;
   logical simulation means for performing a simulation operation of the logical circuit on the basis of the test pattern input data and for outputting information containing logical values of respective logical gates and input and output terminals of the logical circuit;
   fault simulation means for performing a fault simulation on all fault definitions serving as detection targets and for detecting fault propagation route information and detected fault terminal information;

test pattern converting means for assigning undefined values to the test pattern relative to information containing logical values of respective logical gates and input and output terminals of the logical circuit, fault propagation route information and detected fault terminal information; and test pattern extracting means for extracting, as a undefined-value affixed test pattern, the test pattern to which the undefined values are assigned by said test pattern converting means, and outputting a revised test pattern.

2. The test pattern generating apparatus as claimed in claim 1, further comprising:

initial test pattern extracting means for extracting an initial test pattern from all terminals functioning as input terminals on a basis of test pattern input data for which a fault is detected; and said test pattern converting means for assigning undefined values to the initial test pattern extracted by said initial test pattern extracting means.

3. A test pattern generating apparatus for assigning undefined values to input terminal in order to perform a pattern compression of a test pattern, said apparatus comprising:

assigning means for assigning certain values only to input terminals which logically certainly need certain values to detect a set fault when the undefined values are assigned to the input terminals, and assigning undefined values to the other input terminals;

fault simulation means for storing and holding fault propagation route information indicating a logical gate located on a fault propagation route which is obtained during a fault simulating operation, and fault detection terminal information indicating a terminal functioning as an output terminal for which a fault is detected;

fault detection means for extracting the fault which is detected through the fault simulating operation of said fault simulation means, and excluding the detected fault from faults of detection target to detect the fault;

initial test pattern extracting means for extracting an initial test pattern from all terminals functioning as input terminals on a basis of test pattern input data for which a fault is detected; and test pattern converting means for assigning undefined values to the initial test pattern extracted by said initial test pattern extracting means.

4. A test pattern generating apparatus including:

circuit information/fault information input means for receiving information containing connection information and fault defining information of a logical circuit;

test pattern input generating means for generating input data for a test pattern to detect a fault of the logical circuit;

test pattern input assigning means for assigning and setting the test pattern input data to input terminals of the logical circuit;

logical simulation means for performing a simulation operation of the logical circuit on the basis of the test pattern input data assigned to the input terminals, and storing and holding the logical values of respective logical gates and input and output terminals of the logical circuit which are obtained by the logical simulation;

fault defining means for defining fault information serving as a detection target in the fault defining information;

fault simulation means for performing a fault simulation on all fault definitions serving as detection targets in said fault defining means, and storing and holding fault propagation route information indicating a logical gate located on the fault propagation route which is obtained in the fault simulation operation, and fault detected terminal information which indicates a terminal functioning as an output terminal for which a fault is detected;

fault detection means for extracting a fault which is detected through the fault simulation operation of said fault simulation means and deleting the detected fault from the faults serving as the detection targets;

initial test pattern extracting means for extracting an initial test pattern from all terminals functioning input terminals on the basis of the test pattern input data for which a fault is detected;

test pattern converting means for assigning undefined values to the initial test pattern extracted by said initial test pattern extracting means;

final test pattern extracting means for extracting, as a undefined-value affixed test pattern, the initial test pattern to which the undefined values are assigned by said test pattern converting means, and storing and holding the test pattern;

test pattern generation judging means for checking whether a fault serving as a detection target has still existed in the detection defining information, and transmitting predetermined test pattern generation instructing information to said test pattern input generation means when a fault serving as a detection target exists while outputting predetermined mergence instructing information when no detection target fault exists;

all extracted test pattern merging means for performing a mergence processing on undefined-value affixed test patterns which are read out and input by said final test pattern extraction means, to thereby prepare a predetermined test pattern series; and merged test pattern output means for outputting the test pattern series which is merged and generated in said all extraction test pattern merging means.

5. A test pattern generating method for a logical circuit including a processing of assigning undefined values to an initial test pattern which is extracted on the basis of test pattern input data for which a fault is detected, said processing comprising:

a first step for extracting an output terminal for which the fault is detected;

a second step for setting the output terminal as a first current node $C_i$ ($1 \leq i \leq n$: $n \geq 1$) of a search operation which is carried out to select input terminals which are required as minimum requirements to fix logical values of the output terminal;

a third step for checking whether an input side node $P_j$ ($1 \leq j \leq m$: $m \geq 1$) of the node $C_i$ ($1 \leq i \leq n$: $n \geq 1$) exists;

a fourth step for checking whether some nodes $C_i$ exist on a fault propagation route when the input side nodes $P_j$ ($1 \leq j \leq m$: $m \geq 1$) of the nodes $C_i$ ($1 \leq i \leq n$: $n \geq 1$) exist;

a fifth step for affixing to the input side nodes $P_j$ ($1 \leq j \leq m$: $m \geq 1$) of the nodes $C_i$ ($1 \leq i \leq n$: $n \geq 1$) a mark M indicating that a search operation has been performed on the input side nodes $P_j$ ($1 \leq j \leq m$: $m \geq 1$), and setting the mark-affixed input side nodes $P_j$ ($1 \leq j \leq m$: $m \geq 1$) as new nodes $C_i$ ($a \leq i \leq b$: $a \geq 1$, $b=a+m-1$) when the nodes $C_i$ ($1 \leq i \leq n$: $n \geq 1$) exist on a fault propagation route in said fourth step, said fifth step returning to said third step when $i=n$ and returning to the fourth step when $i<n$;

a sixth step for affixing the mark M to nodes Pk ($1 \leq k \leq t$: $t \leq m$) of the input side nodes Pj ($1 \leq j \leq m$: $m \geq 1$), which have logical values Lpk ($1 \leq k \leq t$: $t \leq m$) required minimumly to fix the nodes Ci ($1 \leq i \leq n$: $n \geq 1$) to logical values Lci ($1 \leq i \leq n$: $n \geq 1$), and setting the mark-M affixed input side nodes Pk ($1 \leq k \leq t$: $t \leq m$) as new nodes Ci ($a \leq i \leq b$: $a \geq 1$, $b=a+t-1$) when no node Ci ($1 \leq i \leq n$: $n \geq 1$) exists on the fault propagation route in the fourth step, said sixth step returning to the third step when i=n and returning to the fourth step when i<n;

a seventh step for extracting input terminals to which no mark is affixed while performing no search when no input side node Pj ($1 \leq j \leq m$: $m \geq 1$) of the nodes Ci ($1 \leq i \leq n$: $n \geq 1$) exist in said third step; and an eight step for assigning the undefined values to the initial test pattern by setting the undefined values to the input terminals extracted in the seventh step.

6. A test pattern generating method of assigning undefined values to input terminals, said method comprising:

a first step for receiving information containing connection information and fault defining information of a logical circuit and for inputting terminals of the logical circuit test pattern input data;

a second step for performing a simulation operation of the logical circuit on a basis of the test pattern input data and for outputting information containing logical values of respective logical gates and input and output terminals of the logical circuit;

a third step for performing a fault simulation on all fault definitions serving as detection targets and for detecting fault propagation route information and fault detected terminals information;

a fourth step for assigning undefined values to the test pattern relative to information containing a logical values of respective logical gates and input and output terminals of the logical circuit, fault propagation route information and detected fault terminal information; and a fifth step for extracting, as a undefined-value affixed test pattern, the test pattern to which the undefined values are assigned by said test pattern converting means, and outputting a revised test pattern.

7. The test pattern generating method as claimed in claim 6, further comprising:

a sixth step for extracting an initial test pattern from all terminals functioning as input terminals on a basis of test pattern input data for which a fault is detected; and wherein said fourth step assigns undefined values to the initial test pattern extracted by said sixth step.

* * * * *